(12) United States Patent
Zhang

(10) Patent No.: US 10,305,049 B2
(45) Date of Patent: May 28, 2019

(54) OLED SUBSTRATE AND MANUFACTURE METHOD THEREOF

(71) Applicant: Shenzhen China Star Optoelectronics Technology Co., Ltd., Shenzhen (CN)

(72) Inventor: Xiaoxing Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 276 days.

(21) Appl. No.: 15/508,099

(22) PCT Filed: Feb. 14, 2017

(86) PCT No.: PCT/CN2017/073537
§ 371 (c)(1),
(2) Date: Mar. 1, 2017

(87) PCT Pub. No.: WO2018/120362
PCT Pub. Date: Jul. 5, 2018

(65) Prior Publication Data
US 2019/0088892 A1    Mar. 21, 2019

(30) Foreign Application Priority Data
Dec. 29, 2016 (CN) .......................... 2016 1 1244957

(51) Int. Cl.
*H01L 51/00* (2006.01)
*H01L 27/32* (2006.01)
(Continued)

(52) U.S. Cl.
CPC ...... *H01L 51/0096* (2013.01); *H01L 27/1218* (2013.01); *H01L 27/3246* (2013.01);
(Continued)

(58) Field of Classification Search
CPC ............. H01L 51/0096; H01L 51/5253; H01L 27/1218; H01L 27/3246; H01L 51/0005; H01L 51/56
See application file for complete search history.

(56) References Cited

U.S. PATENT DOCUMENTS

2005/0046342 A1* 3/2005 Park .................... H01L 27/3246
313/504
2005/0263757 A1* 12/2005 Lee ..................... H01L 27/3211
257/40

(Continued)

FOREIGN PATENT DOCUMENTS

CN          1480913 A        3/2004

*Primary Examiner* — Karen Kusumakar
(74) *Attorney, Agent, or Firm* — Leong C. Lei

(57) ABSTRACT

The present invention provides an OLED substrate and a manufacture method thereof. In the manufacture method of the OLED substrate of the present invention, by configuring the silicon film on the top surface of the pixel definition layer to make the top surface possess the excellent hydrophobic characteristic, the OLED material mistakenly sprayed onto the silicon film of the top surface does not stay on the silicon film but quickly falls into the pixel region of the substrate when the OLED material is ink jet printed in the pixel regions of the substrate to effectively prevent the issue that the OLED material stays on the top surface of the pixel definition layer or even slides into the adjacent pixel region to result in color mixing. In the OLED substrate, the color purity of the OLED light emitting layer is high and there is no problem of color mixing.

13 Claims, 3 Drawing Sheets

(51) Int. Cl.
*H01L 51/56* (2006.01)
*H01L 27/12* (2006.01)
*H01L 51/52* (2006.01)

(52) U.S. Cl.
CPC ...... *H01L 51/0005* (2013.01); *H01L 51/5253* (2013.01); *H01L 51/56* (2013.01)

(56) References Cited

U.S. PATENT DOCUMENTS

| | | | | |
|---|---|---|---|---|
| 2008/0277666 | A1* | 11/2008 | Jeon | H01L 27/3244 257/66 |
| 2009/0261712 | A1* | 10/2009 | Choi | H01L 27/3246 313/504 |
| 2010/0171138 | A1* | 7/2010 | Yamazaki | H01L 27/3246 257/98 |
| 2014/0042400 | A1* | 2/2014 | Kim | H01L 51/102 257/40 |
| 2014/0239268 | A1* | 8/2014 | Kim | H01L 51/0013 257/40 |
| 2014/0252321 | A1* | 9/2014 | Pyon | H01L 27/3216 257/40 |
| 2014/0353595 | A1* | 12/2014 | Choi | H01L 27/32 257/40 |

* cited by examiner

US 10,305,049 B2

OLED SUBSTRATE AND MANUFACTURE METHOD THEREOF

FIELD OF THE INVENTION

The present invention relates to a display technology field, and more particularly to an OLED substrate and a manufacture method thereof.

BACKGROUND OF THE INVENTION

The Organic Light Emitting Display (OLED) device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The OLED display element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, the Indium Tin Oxide (ITO) electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

The OLED panel technology based on the printing skill becomes the advanced and new technology at present. The technology uses ink jet printing process to manufacture the organic functioning layers (including the hole injection layer, the hole transporting layer, the light emitting layer, the electron transporting layer and the electron injection layer) of the OLED element and can tremendously promote the usage efficiency of the OLED material to reduce the production cost of the OLED panel, and meanwhile, possesses the technical potential of manufacturing the flexible OLED panel, and the large-scale research on this technology has become the development direction of OLED display.

In the process of printing the OLED material, one manufacture process of the hydrophobic pixel definition layer (bank) play a decisive role of the following success printing of the OLED material. The function of the hydrophobic pixel definition layer is to implement the pixel definition to form the red (R) pixel regions, the green (G) pixel regions and the blue (B) pixel regions. Then, the OLED material will be printed in these pixel regions. In order to enable the OLED material to 100% enter into the pixel regions, the pixel definition layer requires absolute surface hydrophobicity so that as printing, the OLED material will not stay on the top of the pixel definition layer and even flows into the adjacent pixel region to result in color mixing. In order to realize the absolute surface hydrophobicity of the pixel definition layer, the common means for now is to add hydrophobic substances in the ordinary organic photoresist material to obtain the hydrophobic organic photoresist material. Then, the hydrophobic organic photoresist material is used to manufacture the pixel definition layer. The surface of the ultimately resulting pixel definition layer possesses the hydrophobic characteristic. However, the process of the method is complicated and the surface hydrophobicity of the resulting pixel definition layer is often not ideal, the issue that the OLED material stays on the top of the pixel definition layer as printing or the caused color mixing cannot be effectively solved.

SUMMARY OF THE INVENTION

An objective of the present invention is to provide a manufacture method of an OLED substrate, which can avoid the color mixing problem that the OLED material stops on the top surface of the pixel definition layer or even slides into the adjacent pixel region during the ink jet printing.

Another objective of the present invention is to provide an OLED substrate, in which the color purity of the OLED light emitting layer is high and there is no problem of color mixing.

For realizing the aforesaid objectives, the present invention provides a manufacture method of an OLED substrate, comprising steps of:

step 1, providing a substrate, and forming a pixel definition layer on the substrate, and the pixel definition layer being configured with a plurality of through holes, and the plurality of through holes respectively defining a plurality of pixel regions on the substrate;

step 2, depositing a silicon film on the pixel definition layer and the substrate, and the silicon film comprising a portion covering a top surface of the pixel definition layer and a portion covering the plurality of through holes in the pixel definition layer;

step 3, patterning the silicon film to remove the portion covering the plurality of through holes in the pixel definition layer in the silicon film and to preserve the portion covering the top surface of the pixel definition layer in the silicon film;

step 4, respectively ink jet printing an OLED material in the plurality of pixel regions of the substrate to form a plurality of OLED light emitting layers.

In step 2, a plasma enhanced chemical vapor deposition method is used to deposit the silicon film.

A material of the pixel definition layer is organic photoresist, and a thickness of the pixel definition layer is 1 μm-3 μm.

A material of the silicon film is amorphous silicon, and a thickness of the silicon film is 200 A-500 A.

Surfaces of the plurality of pixel regions of the substrate are hydrophilic, and the OLED material is a hydrophilic material.

The present invention further provides an OLED substrate, comprising: a substrate, a pixel definition layer located on the substrate, a plurality of through holes located in the pixel definition layer, a silicon film being located on the pixel definition layer and covering a top surface of the pixel definition layer and a plurality of OLED light emitting layers located on the substrate and in the plurality of pixel regions respectively corresponding to the plurality of through holes.

The substrate is a TFT substrate.

A material of the pixel definition layer is organic photoresist, and a thickness of the pixel definition layer is 1 μm-3 μm.

A material of the silicon film is amorphous silicon, and a thickness of the silicon film is 200 A-500 A.

Surfaces of the plurality of pixel regions of the substrate are hydrophilic, and the OLED light emitting layers are formed by ink jet printing the OLED material which is hydrophilic.

The present invention further provides an OLED substrate, comprising: a substrate, a pixel definition layer located on the substrate, a plurality of through holes located in the pixel definition layer, a silicon film being located on the pixel definition layer and covering a top surface of the pixel definition layer and a plurality of OLED light emitting layers located on the substrate and in the plurality of pixel regions respectively corresponding to the plurality of through holes;

wherein the substrate is a TFT substrate;

wherein a material of the pixel definition layer is organic photoresist, and a thickness of the pixel definition layer is 1 μm-3 μm.

The benefits of the present invention are: the present invention provides a manufacture method of an OLED substrate. By configuring the silicon film on the top surface of the pixel definition layer to make the top surface of the pixel definition layer possess the excellent hydrophobic characteristic, the OLED material mistakenly sprayed onto the silicon film of the top surface of the pixel definition layer does not stay on the silicon film but quickly falls into the pixel region of the substrate when the OLED material is ink jet printed in the pixel regions of the substrate to effectively prevent the issue that the OLED material stays on the top surface of the pixel definition layer or even slides into the adjacent pixel region to result in color mixing. The present invention provides an OLED substrate, in which the color purity of the OLED light emitting layer is high and there is no problem of color mixing.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
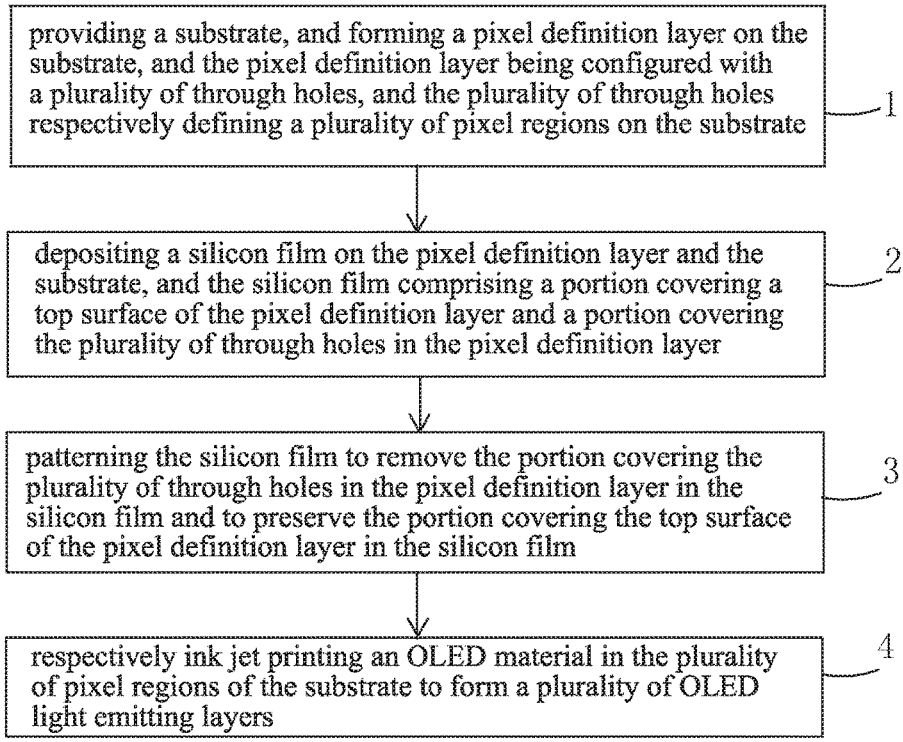
FIG. 1 is a flowchart of a manufacture method of an OLED substrate according to the present invention.
Figure 2:
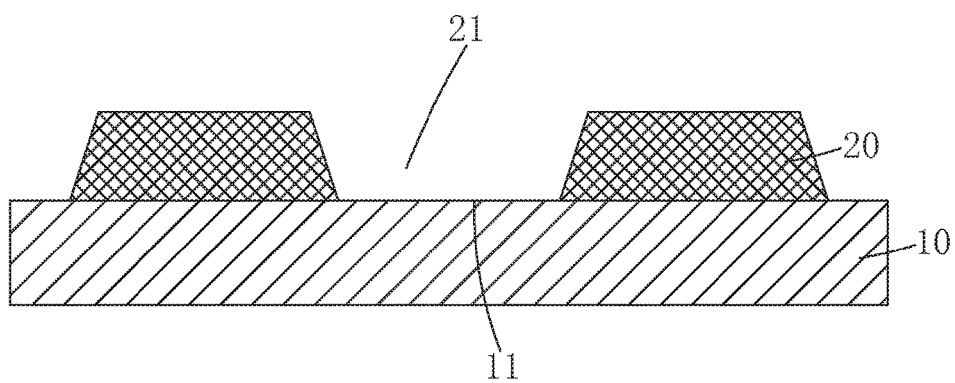
FIG. 2 is a diagram of step 1 of a manufacture method of an OLED substrate according to the present invention.

Please refer to FIG. 1. The present invention provides a manufacture method of an OLED substrate, comprising steps of:

step 1, as shown in FIG. 2, providing a substrate 10, and forming a pixel definition layer 20 on the substrate 10, and the pixel definition layer 20 being configured with a plurality of through holes 21, and the plurality of through holes 21 respectively defining a plurality of pixel regions 11 on the substrate 10;

Specifically, the substrate 10 is a TFT substrate.

Specifically, a material of the definition layer 20 is an ordinary organic photoresist. The ordinary organic photoresist material has a certain hydrophobicity, but the hydrophobicity is poorer and cannot meet the requirement of ink jet printing.

Specifically, a thickness of the pixel definition layer 20 is 1 μm-3 μm.

Figure 3:
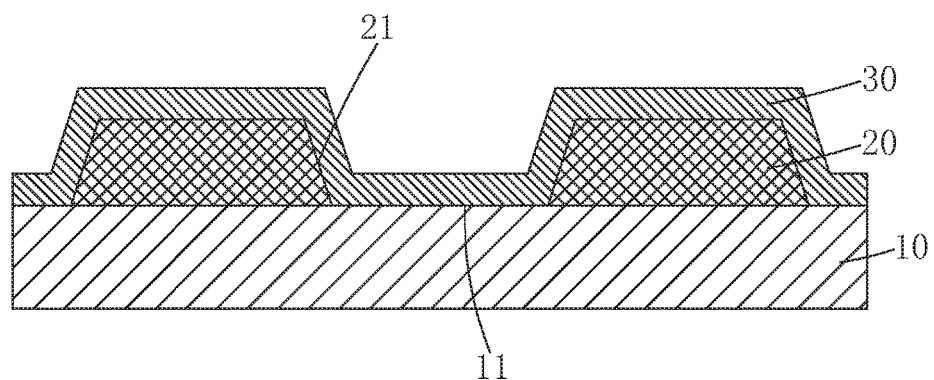
FIG. 3 is a diagram of step 2 of a manufacture method of an OLED substrate according to the present invention.

Specifically, surfaces of the plurality of pixel regions 11 of the substrate 10 are hydrophilic.

step 2, as shown in FIG. 3, depositing a silicon film 30 on the pixel definition layer 20 and the substrate 10, and the silicon film 30 comprising a portion covering a top surface of the pixel definition layer 20 and a portion covering the plurality of through holes 21 in the pixel definition layer 20.

Specifically, in step 2, a plasma enhanced chemical vapor deposition (PECVD) method is used to deposit the silicon film 30.

Specifically, a material of the silicon film 30 is amorphous silicon.

Figure 4:
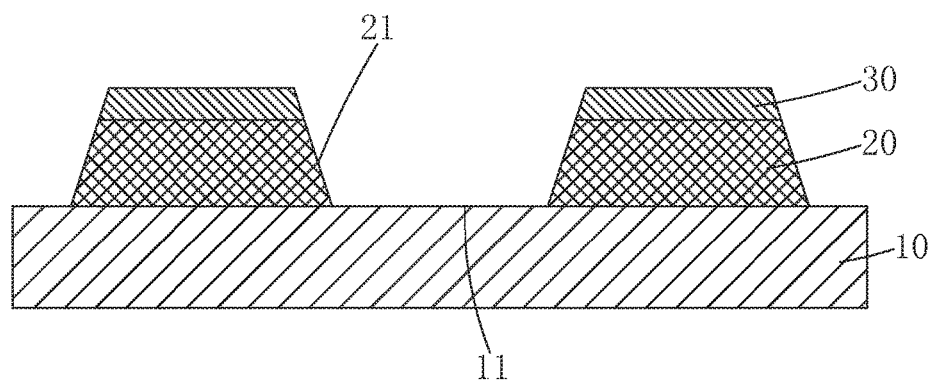
FIG. 4 is a diagram of step 3 of a manufacture method of an OLED substrate according to the present invention.

Specifically, a thickness of the silicon film 30 is 200 A-500 A.

step 3, as shown in FIG. 4, patterning the silicon film 30 to remove the portion covering the plurality of through holes 21 in the pixel definition layer 20 in the silicon film 30 and to preserve the portion covering the top surface of the pixel definition layer 20 in the silicon film 30.

Figure 5:
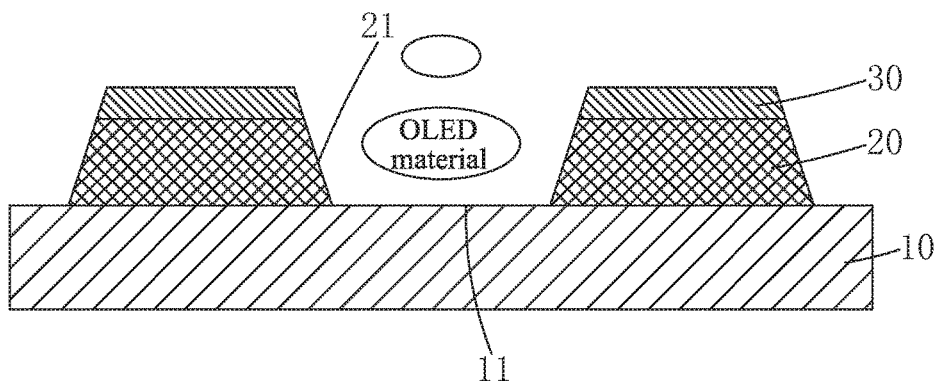
FIG. 5 and FIG. 6 are diagrams of step 4 of a manufacture method of an OLED substrate according to the present invention and FIG. 6 is a structure diagram of an OLED substrate of the present invention.
Figure 6:
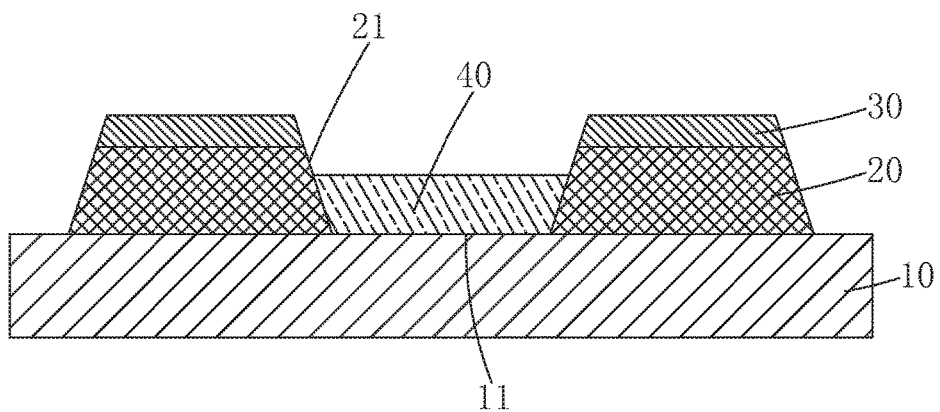

Specifically, in step 3, a photolithographic process is used to pattern the silicon film 30.

step 4, as shown in FIG. 5 and FIG. 6, respectively ink jet printing an OLED material in the plurality of pixel regions 11 of the substrate 10 to form a plurality of OLED light emitting layers 40.

Specifically, the OLED light emitting layer 40 comprises a hole injection layer (not shown) located on the substrate 10, a hole transporting layer located on the hole injection layer, a light emitting layer (not shown) located on the hole transporting layer, an electron transporting layer (not shown) located on the light emitting layer and an electron injection layer (not shown) located on the electron transporting layer.

Specifically, the OLED material is a hydrophilic material.

Specifically, in step 4, the OLED material may appear the situation of the incomplete alignment in the ink jet printing process. Namely, there might be little OLED material is printed on the silicon 30 at the edge of the through hole 21. However, because the silicon 30 possess the excellent hydrophobic characteristic so that the OLED material mistakenly sprayed onto the silicon film 30 at the edge of the through hole 21 does not stay on the silicon film 30 but quickly falls into the pixel region 11.

In the aforesaid manufacture method of the OLED substrate, by configuring the silicon film 30 on the top surface of the pixel definition layer 20 to make the top surface of the pixel definition layer 20 possess the excellent hydrophobic characteristic, the OLED material mistakenly sprayed onto the top surface of the pixel definition layer 20 does not stay on the silicon film 30 but quickly falls into the pixel region 11 of the substrate 10 when the OLED material is ink jet printed in the pixel regions 11 of the substrate 10 to effectively prevent the issue that the OLED material stays on the top surface of the pixel definition layer 20 or even slides into the adjacent pixel region 11 to result in color mixing.

Please refer to FIG. 6. On the basis of the aforesaid manufacture method of the OLED substrate, the present invention further provides an OLED substrate, comprising: a substrate 10, a pixel definition layer 20 located on the substrate 10, a plurality of through holes 21 located in the pixel definition layer 20, a silicon film 30 being located on the pixel definition layer 20 and covering a top surface of the pixel definition layer 20 and a plurality of OLED light emitting layers 40 located on the substrate 10 and in the plurality of pixel regions 11 respectively corresponding to the plurality of through holes 21.

Specifically, the substrate 10 is a TFT substrate.

Specifically, surfaces of the plurality of pixel regions 11 of the substrate 10 are hydrophilic, and the OLED light emitting layers 40 are formed by ink jet printing the OLED material which is hydrophilic.

Specifically, a material of the pixel definition layer 20 is an ordinary organic photoresist.

Specifically, a thickness of the pixel definition layer 20 is 1 µm-3 µm.

Specifically, a material of the silicon film 30 is amorphous silicon.

Specifically, a thickness of the silicon film 30 is 200 A-500 A.

Specifically, the OLED light emitting layer 40 comprises a hole injection layer (not shown) located on the substrate 10, a hole transporting layer located on the hole injection layer, a light emitting layer (not shown) located on the hole transporting layer, an electron transporting layer (not shown) located on the light emitting layer and an electron injection layer (not shown) located on the electron transporting layer.

In the aforesaid OLED substrate, by configuring the silicon film 30 on the top surface of the pixel definition layer 20 to make the top surface of the pixel definition layer 20 possess the excellent hydrophobic characteristic, thus the issue that the OLED material stays on the top surface of the pixel definition layer 20 or even slides into the adjacent pixel region 11 to result in color mixing in the ink jet printing process of the OLED light emitting layers 40 can be effectively prevented. Therefore, in the OLED substrate of the present invention, the color purity of the OLED light emitting layers 40 is high, and no color mixing problem will not occur.

In conclusion, the present invention provides an OLED substrate and a manufacture method thereof. In the manufacture method of the OLED substrate of the present invention, by configuring the silicon film on the top surface of the pixel definition layer to make the top surface of the pixel definition layer possess the excellent hydrophobic characteristic, the OLED material mistakenly sprayed onto the silicon film of the top surface of the pixel definition layer does not stay on the silicon film but quickly falls into the pixel region of the substrate when the OLED material is ink jet printed in the pixel regions of the substrate to effectively prevent the issue that the OLED material stays on the top surface of the pixel definition layer or even slides into the adjacent pixel region to result in color mixing. In the OLED substrate of the present invention, the color purity of the OLED light emitting layer is high and there is no problem of color mixing.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an OLED substrate, comprising steps of:
    step 1, providing a substrate, and forming a pixel definition layer on the substrate, and the pixel definition layer being configured with a plurality of through holes, and the plurality of through holes respectively defining a plurality of pixel regions on the substrate;
    step 2, depositing a silicon film on the pixel definition layer and the substrate, and the silicon film comprising a portion covering a top surface of the pixel definition layer and a portion covering the plurality of through holes in the pixel definition layer;
    step 3, patterning the silicon film to remove the portion covering the plurality of through holes in the pixel definition layer in the silicon film and to preserve the portion covering the top surface of the pixel definition layer in the silicon film;
    step 4, respectively ink jet printing an OLED material in the plurality of pixel regions of the substrate to form a plurality of OLED light emitting layers.

2. The manufacture method of the OLED substrate according to claim 1, wherein in step 2, a plasma enhanced chemical vapor deposition method is used to deposit the silicon film.

3. The manufacture method of the OLED substrate according to claim 1, wherein a material of the pixel definition layer is organic photoresist, and a thickness of the pixel definition layer is 1 µm-3 µm.

4. The manufacture method of the OLED substrate according to claim 1, wherein a material of the silicon film is amorphous silicon, and a thickness of the silicon film is 200 A-500 A.

5. The manufacture method of the OLED substrate according to claim 1, wherein surfaces of the plurality of pixel regions of the substrate are hydrophilic, and the OLED material is a hydrophilic material.

6. An OLED substrate, comprising: a substrate, a pixel definition layer located on the substrate, a plurality of through holes located in the pixel definition layer, a silicon film being located on the pixel definition layer and covering a top surface of the pixel definition layer and a plurality of OLED light emitting layers located on the substrate and in the plurality of pixel regions respectively corresponding to the plurality of through holes.

7. The OLED substrate according to claim 6, wherein the substrate is a TFT substrate.

8. The OLED substrate according to claim 6, wherein a material of the pixel definition layer is organic photoresist, and a thickness of the pixel definition layer is 1 µm-3 µm.

9. The OLED substrate according to claim 6, wherein a material of the silicon film is amorphous silicon, and a thickness of the silicon film is 200 A-500 A.

10. The OLED substrate according to claim 6, wherein surfaces of the plurality of pixel regions of the substrate are hydrophilic, and the OLED light emitting layers are formed by ink jet printing the OLED material which is hydrophilic.

11. An OLED substrate, comprising: a substrate, a pixel definition layer located on the substrate, a plurality of through holes located in the pixel definition layer, a silicon film being located on the pixel definition layer and covering a top surface of the pixel definition layer and a plurality of OLED light emitting layers located on the substrate and in the plurality of pixel regions respectively corresponding to the plurality of through holes;

wherein the substrate is a TFT substrate;

wherein a material of the pixel definition layer is organic photoresist, and a thickness of the pixel definition layer is 1 μm-3 μm.

12. The OLED substrate according to claim 11, wherein a material of the silicon film is amorphous silicon, and a thickness of the silicon film is 200 A-500 A.

13. The OLED substrate according to claim 11, wherein surfaces of the plurality of pixel regions of the substrate are hydrophilic, and the OLED light emitting layers are formed by ink jet printing the OLED material which is hydrophilic.

* * * * *